United States Patent
Li et al.

(10) Patent No.: US 9,647,624 B2
(45) Date of Patent: May 9, 2017

(54) ADAPTIVE LOUDNESS LEVELLING METHOD FOR DIGITAL AUDIO SIGNALS IN FREQUENCY DOMAIN

(71) Applicant: STMICROELECTRONICS ASIA PACIFIC PTE LTD, Singapore (SG)

(72) Inventors: Wei Li, Singapore (SG); Sapna George, Singapore (SG)

(73) Assignee: STMicroelectronics Asia Pacific PTE Ltd., Singapore (SG)

( * ) Notice: Subject to any disclaimer, the term of this patent is extended or adjusted under 35 U.S.C. 154(b) by 81 days.

(21) Appl. No.: 14/588,398

(22) Filed: Dec. 31, 2014

(65) Prior Publication Data

US 2016/0191007 A1    Jun. 30, 2016

(51) Int. Cl.
H03G 3/00    (2006.01)
H03G 9/02    (2006.01)
H03G 9/00    (2006.01)

(52) U.S. Cl.
CPC ............ H03G 9/025 (2013.01); H03G 9/005 (2013.01)

(58) Field of Classification Search
CPC ...................................................... H03G 3/20
USPC ..... 381/104–107, 94.1, 94.3, 312, 317, 318; 375/367
See application file for complete search history.

(56) References Cited

U.S. PATENT DOCUMENTS

| 8,275,611 | B2 | 9/2012 | Zong et al. | |
|---|---|---|---|---|
| 8,437,480 | B2 | 5/2013 | Zong et al. | |
| 2004/0101038 | A1* | 5/2004 | Etter | H04B 1/123 375/222 |
| 2008/0189104 | A1* | 8/2008 | Zong | G10L 21/02 704/226 |
| 2009/0304190 | A1* | 12/2009 | Seefeldt | G10L 25/69 381/56 |
| 2014/0016791 | A1* | 1/2014 | Smith | H03G 3/20 381/57 |

OTHER PUBLICATIONS

ITU-R, Recommendation ITU-R BS.1770-3, "Algorithms to measure audio programme loudness and true-peak audio level", Aug. 2012.*
International Telecommunication Union, "Algorithms to measure audio programme loudness and true-peak audio level," Recommendation ITU-R BS.1770-3, Aug. 2012, 24 pages.

* cited by examiner

Primary Examiner — Xu Mei
Assistant Examiner — Ammar Hamid
(74) Attorney, Agent, or Firm — Seed IP Law Group LLP

(57) ABSTRACT

Embodiments of the present disclosure are directed to techniques for adjusting the amplitude of a digital audio signal in the frequency domain to control the perceived loudness of the audio signal at a desired level. In one embodiment, a method first adjusts the audio signal to a desired loudness level by applying an adaptive wideband gain and thereafter a multi-band compression is applied to further reduce a dynamic range of the audio signal, and noise analysis and temporal masking operations are also performed to provide a pleasant sound for a listener or listeners.

28 Claims, 8 Drawing Sheets

ADAPTIVE LOUDNESS LEVELLING METHOD FOR DIGITAL AUDIO SIGNALS IN FREQUENCY DOMAIN

BACKGROUND

Technical Field

The present disclosure relates generally to audio signal processing, and more specifically to adjusting the amplitude of a digital audio signal in the frequency domain to control the perceived loudness of the audio signal at a desired level.

Description of the Related Art

In the literature, many attempts have been made to tackle the issue of varying volume across different materials, e.g., television programs. Common techniques include automatic gain control (AGC) and dynamic range control (DRC). In short, both techniques measure the level of an audio signal in some manner and then gain-modify the signal by an amount that is a function of the measured level. Some techniques also use scene analysis techniques to help calculate the gain applied to the input signal. These techniques can be implemented in time domain or frequency domain. A previously designed a single-band loudness leveller in the time domain is disclosed in U.S. Pat. No. 8,437,480 B2.

The conventional methods used in frequency domain techniques normally include: 1) split samples corresponding to a digitized audio signal to overlapping blocks that are then transformed to frequency domain using STFT or other transform; 2) separate the frequency spectrum to several sub-bands and objectively determine the perceived loudness of the audio signal; 3) scale the loudness of individual sub-bands, adjusting the overall perceived loudness while preserving the perceived loudness spectrum or timbre and 4) transform the data back to time domain.

BRIEF SUMMARY

Embodiments of the present disclosure relate to audio signal processing, and more specifically to adjusting the amplitude of a digital audio signal in the frequency domain to control the perceived loudness of the audio signal at a desired level. In one embodiment, a method first adjusts the audio signal to a desired loudness level by applying an adaptive wideband gain and thereafter a multi-band compression is applied to further reduce a dynamic range of the audio signal, and noise analysis and temporal masking operations are also performed to provide a pleasant sound for a listener or listeners.

In one embodiment, a system includes an automatic gain control (AGC) module, a multi-band dynamic compressor (MDRC) module and a noise detection module. The system first segments an input stream of digitized audio signal samples in the time domain into overlapping frames, and thereafter applies an analysis window to these frames, and each frame is then converted into the frequency domain using the Fast Fourier Transform (FFT) algorithm. The FFT algorithm may simply be referred to as the FFT or as the FFT of a given signal in the following description.

A frequency weighting curve is then applied to the frequency data from the FFT for each frame, and wideband loudness for the frame is then calculated. This weighted frequency data is then further smoothed and the peak loudness value for the frame is calculated. The peak loudness value is used in calculating the wideband gain for automatic gain control and simulates a temporal masking effect in the AGC and MDRC modules. A noise detection module analyzes the frequency data for each frame and determines whether the current frame has a high or low probability of being noise. The AGC module levels an output loudness to the desired loudness level, while the MDRC module further reduces the dynamic range of the audio signal in a multi-band scale using a relatively faster smoothing factor. After applying the gain in frequency domain from the AGC and MDRC modules, the frequency domain data is converted back into the time domain using the inverse FFT (IFFT) and is then this processed time domain data is multiplied with a synthesis window, and after an overlap-and-adding process, a final audio output frame of data is generated and would then typically be supplied to a suitable device listening device for converting the audio output data into an audible sounds.

DETAILED DESCRIPTION

Television (TV) programs are often mastered at different conditions. For example, TV commercials tend to be much louder than news broadcast or conversation in a drama broadcast. When watching TV, people often have to manually adjust the volume of the current program to reach a comfortable loudness level. Embodiments of the present disclosure eliminate this annoying experience by constantly measuring and analyzing the audio signal and maintaining the perceived loudness of the audio signal at a consistent level. These embodiments are not limited to TV but may be used in any application with audio sources of varying volume, for example in MP3 players, radio broadcasts, telecommunications applications, and so on.

In the following description, certain details are set forth in conjunction with the described embodiments of the present disclosure to provide a sufficient understanding of the disclosure. One skilled in the art will appreciate, however, that other embodiments of the disclosure may be practiced without these particular details. Furthermore, one skilled in the art will appreciate that the example embodiments described below do not limit the scope of the present disclosure, and will also understand that various modifications, equivalents, and combinations of the disclosed embodiments and components of such embodiments are within the scope of the present disclosure. Embodiments including fewer than all the components of any of the respective described embodiments may also be within the scope of the present disclosure although not expressly described in detail below. The operation of well-known components and/or processes has not been shown or described in detail below to avoid unnecessarily obscuring the present disclosure. Finally, also note that when referring generally to any one of the microphones $M_0$-$M_n$ of the microphone array 104, the subscript may be omitted (i.e., microphone M) and included only when referring to a specific one of the microphones.

Figure 2:
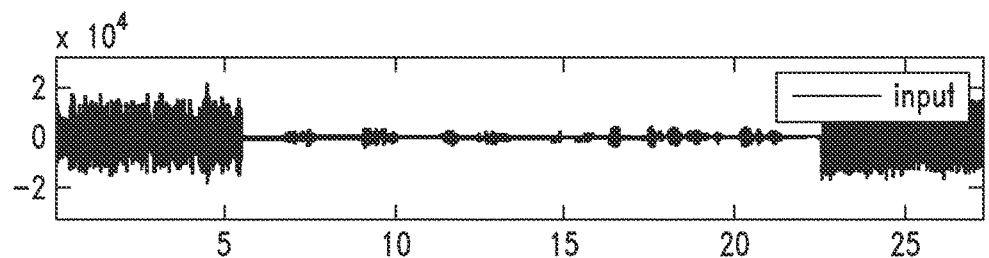
FIG. 2 is series of graphs showing the operation of the system of FIG. 1 in controlling a loudness level of an audio signal.
Figure 2:
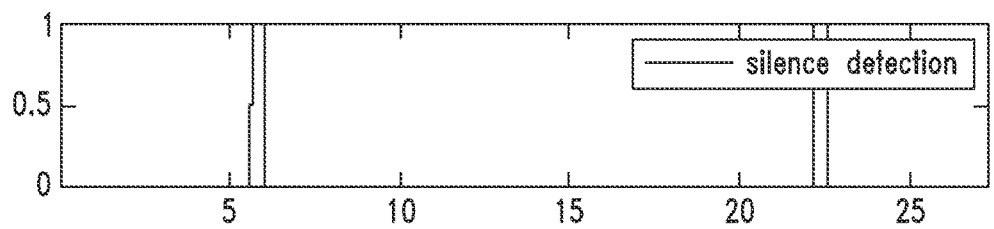
Figure 2:
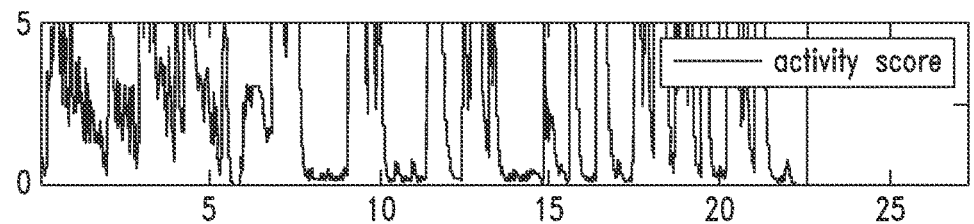
Figure 2:
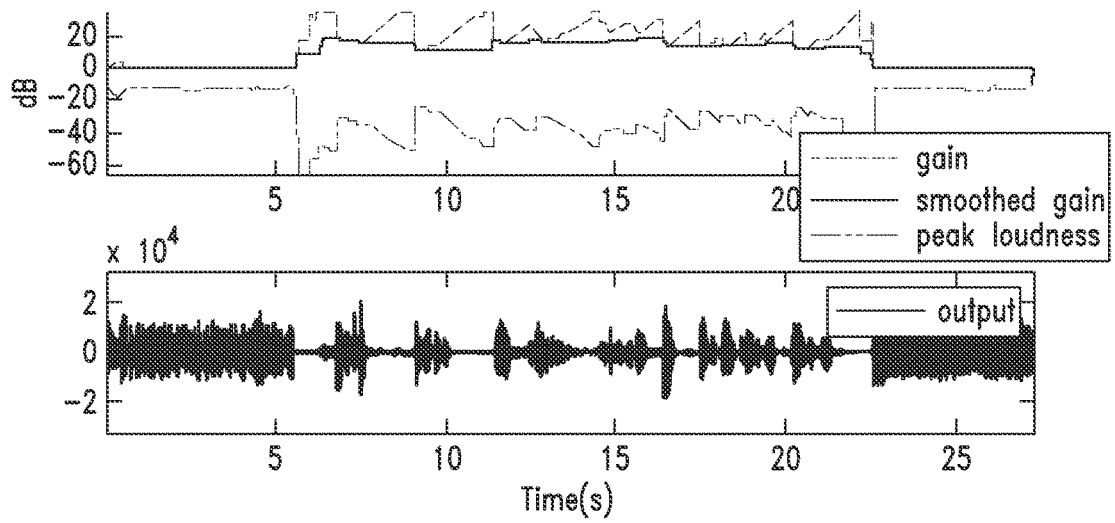
Figure 11:
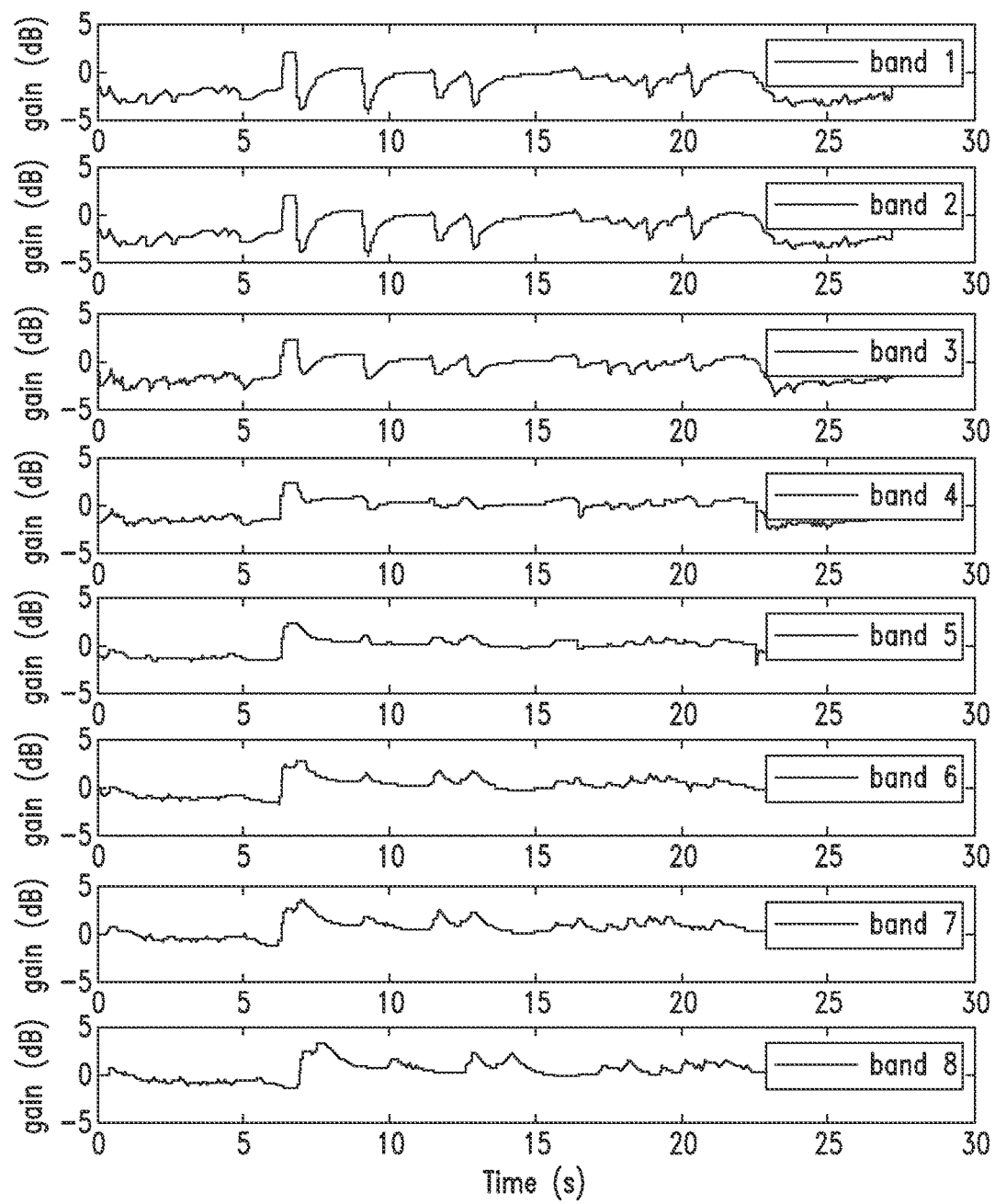
FIG. 11 is a number of graphs showing changes in the gain over time for different frequency bands in multiband dynamic range compression process.

The present disclosure is directed to methods, in the frequency domain, which maintain an audio signal (single or multiple channels) at a consistent loudness level. The AGC module ensures the output loudness level match the desired loudness level. The MDRC module further reduce the dynamic range around the desired loudness level in eight sub-bands. The noise detection module help prevents annoying artefacts like "breathing" or "pumping" of background noise. Furthermore the usage of temporal masking technique ensures that the processed sound is smooth and pleasant to listen to. The effectiveness of the proposed method is clearly illustrated in FIGS. 2 and 11, as will be described in more detail below. In FIG. 2, from top to bottom, the first subplot is the input signal; second is the silence detention results, from the plot we can see that one program switch to another type of program and then switched back, which conform to the actual scenario; third is the activity score calculated by noise detection module, if we use 1.0 as the threshold, we can see that the noise is accurately detected; fourth is the gain calculated by AGC module, three quantities are displayed in this subplot, the peak loudness value calculated in peak loudness estimation module, wideband gain derived based on peak loudness without smoothing, smoothed wideband gain across time based on activity score and temporal masking techniques; and final one is the output signal. FIG. 11 shows the gain change over time for different bands in MDRC module.

Figure 1:
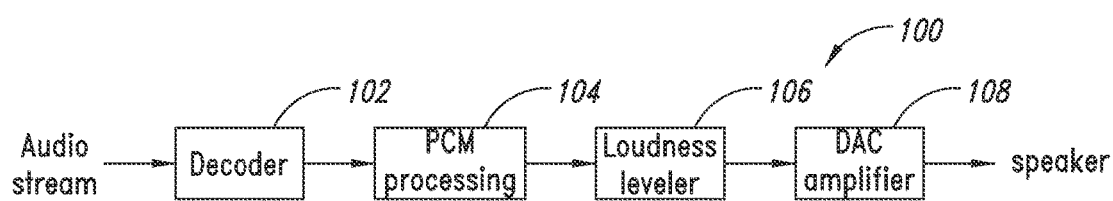
FIG. 1 is a functional block diagram of an adaptive loudness levelling system according to one embodiment of the present disclosure.

Embodiments of the present disclosure solve or compensate the problem of greatly varying volumes from different audio sources by processing the audio signal by a loudness leveler right before the audio signal is sent to a digital-to-analog (DAC) converter that generates the analog audio signal that is applied to a speaker for playback. The loudness leveler typically is a block of circuitry in an audio processing chain of the time domain audio input samples, and an example of such an audio processing chain is depicted in FIG. 1. The loudness leveler may also be placed earlier in the chain, as long as the processing blocks following the leveler do not change the volume significantly and adaptively. The desired result of a loudness leveler, when viewed in the digital domain, is illustrated in FIG. 2.

Figure 3:
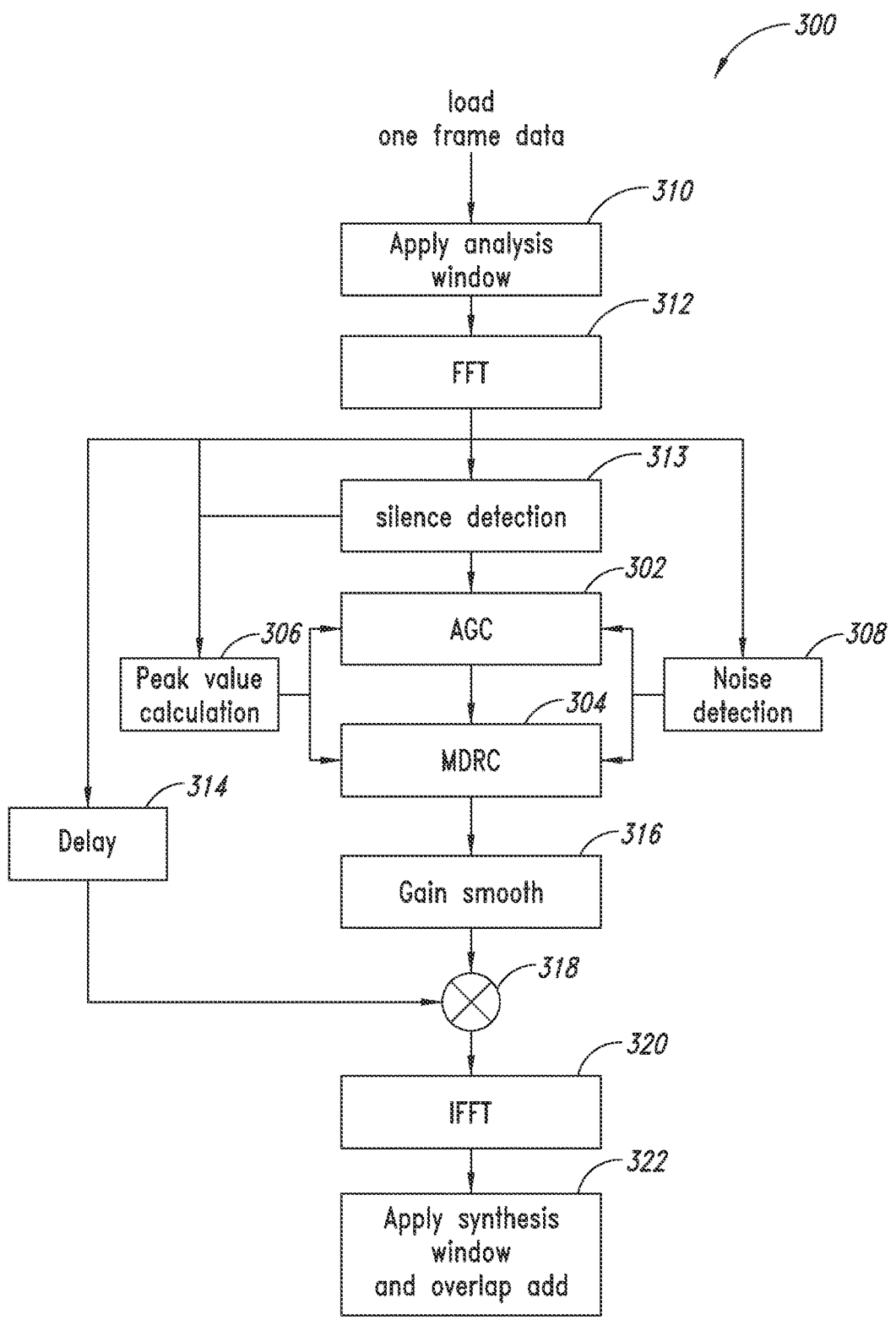
FIG. 3 is a functional block and flow diagram of an adaptive loudness levelling system for processing an input stream of audio data in the time domain according to one embodiment of the present disclosure.

A high-level functional block and flow diagram of a system and method 300 according to an embodiment of the present disclosure is shown in FIG. 3. The primary control parameter is the desired loudness level. This parameter can either be in the digital domain (in terms of decibels (dB) Full Scale (dBFS), or in the analog domain in terms of dB Sound Pressure Level (dB SPL). If dB SPL is used for specifying the loudness level, the mapping between dB FS and dB SPL used by the amplifier should would also typically be provided.

The system and method 300 includes modules 302-322, which include an automatic gain control (AGC) module 302, a multi-band dynamic compressor (MDRC) module 304, a peak loudness estimation module 306 and a noise detection module 308. The peak loudness estimation module 306 and noise detection module 308 provide common functions to both modules. The AGC module 302 is wideband and uses the peak loudness value calculated in the peak loudness estimation module 306 to derive an adaptive target gain required to bring the current audio content to the desired loudness level. Noise detection results from module 308 and temporal masking techniques are employed to ensure there is no excessive change in the target gain unless necessary. The MDRC module 304 separates the frequency spectrum of the frames into several sub-bands, and further compresses the signal for each sub-band after automatic gain control by the AGC module 302. In one embodiment, the system and method 300 may operate at all sampling frequencies from 8 KHz to 192 Khz with different FFT sizes for the FFT module 312, sub-band boundaries in the MDRC module 304 and some other parameters.

In one embodiment, the loudness levelling system and method 300 can handle up to an arbitrary number of channels, although today's applications typically include seven (7) main channels plus one (1) subwoofer channel and would this would accordingly typically be the most complicated use case. Each channel can be processed independently or jointly, each having its advantages and disadvantages. Levelling the loudness of each channel separately allows fine control per channel, but having the risk of changing the balance between channels and consuming slightly more computational resources. The opposite is true for levelling the loudness of all channels jointly. However the multiple channels are processed the core methods according to disclosed embodiments remain the same.

In a typical application, such as, for example, in a TV, the system and method 300 could be applied after the audio stream has been decoded, and processed, but before the pulse-code modulation (PCM) samples are sent to the digital-to-analog (DAC) converter. FIG. 1 is a functional block diagram of such an audio post-processing chain.

The high-level functional block diagram of one embodiment of the proposed disclosure is depicted in FIG. 3. In such a configuration, the system and method 300 works in block-processing mode; that is, the input stream audio samples in the time domain is segmented into overlapping frames, each frame processed separately, and output obtained by overlap-and-adding the processed frames. It comprises an AGC (automatic gain controller) 302, a MDRC (multi-band dynamic compressor) 304, a peak loudness estimation module 306 a noise detection module 308, and as well as the analysis window module 310, FFT module 312, silence detection module 313, delay module 314, gain smoothing module 316, multiplication module 318, IFFT module 320 and synthesis window and overlap add module 322 as shown in the figure.

The input windowing and frequency analysis according to embodiments of the present disclosure will now be described in more detail. In one embodiment, the input signal is segmented into overlapping frames. The overlap ratio is typically chosen to be half; that is, the first half of the current frame is in fact the second half of the previous frame.

Figure 4:
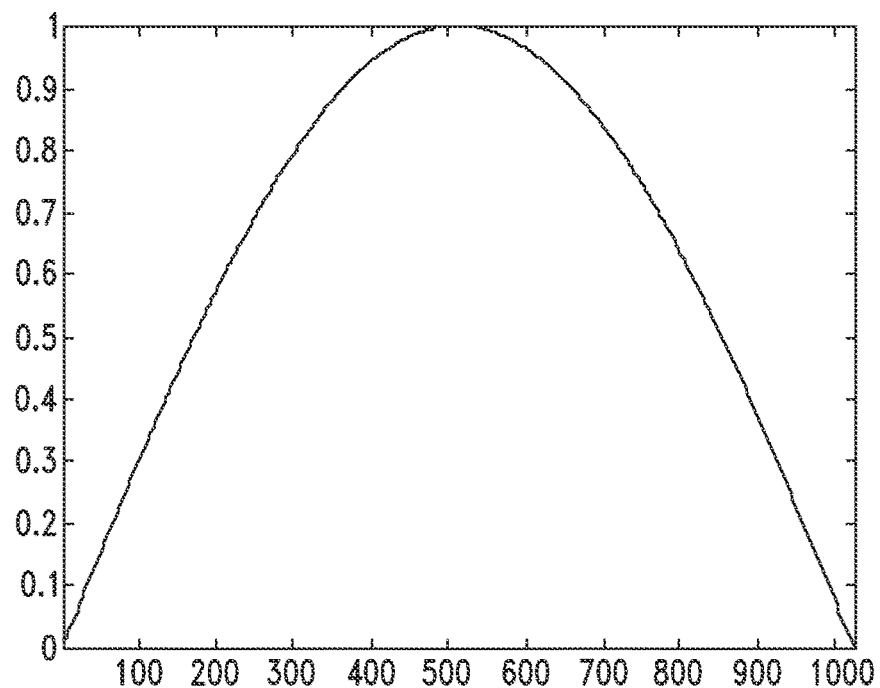
FIG. 4 shows an analysis window for windowing frames of the input stream of audio in the time domain.

An analysis window is multiplied with the frame to ensure smooth transition from frame to frame, and to suppress high frequencies introduced by segmentation. The windowed frame is then transformed to the frequency domain by a frequency analysis method, where Fast Fourier Transform (FFT) is often used. For sampling frequency of 48 KHz, a frame size of 1024 or 512 samples is often a good trade-off between frequency resolution and time resolution. The analysis window for 1024 points is plotted in FIG. 4. The window used here is the squared root of the popular Hanning window. And the reason why it is square rooted is that we also use a synthesis window in the output.

Figure 5:
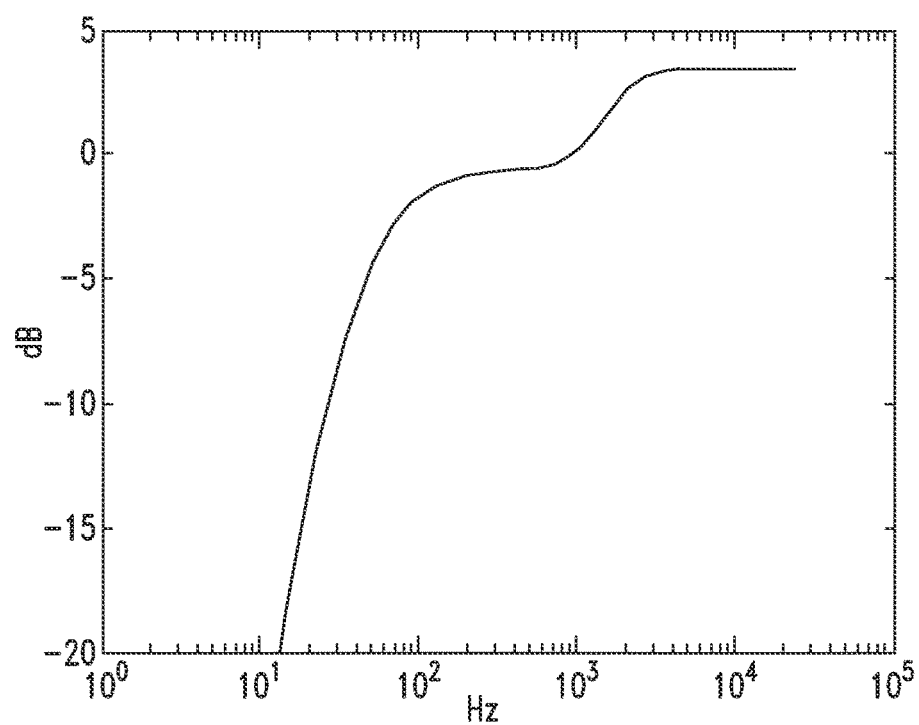
FIG. 5 shows the frequency response of the weighting curve defined in the ITU-R BS.1770 recommendation from the International Telecommunications Union.

The peak loudness estimation according to embodiments of the present disclosure will now be described in more detail. Before wideband loudness for a current frame is calculated, a frequency-weighting curve is applied to account for the human hearing system, which is more sensitive to some frequencies than others and its frequency response varies with sound level. An equal-loudness contour is a measure of sound pressure over the frequency spectrum that the listener perceives as equally loud when presented with pure steady tones. To achieve a consistent loudness, it is therefore necessary to compensate the sensitivity difference of the human hearing system by applying an inversed weighting curve to the source signal. In one embodiment of the present disclosure, the frequency weighting curve used is based on the ITU-R BS.1770 recommendation from the International Telecommunications Union. This curve is shown in FIG. 5.

Let x(i,n) be the time domain signal for frame i, X(i, k) is the frequency domain signal for frame i, and X'(i,k) is the frequency signal after applying the frequency weighting curve. Then the loudness of the current frame can be calculated by the following equation.

$$wb\_RMSdB = 10 \times \log_{10}\left(2 \times \sum_{k=1}^{k=N} \left(\frac{|X'(i,k)|}{N}\right)^2\right) \quad \text{(Eq. 1)}$$

where H(k) is the frequency weighting curve (K-weighting curve in ITU-R BS.1770). And $$X'(i,k) = X(i,k) \times H(k) \quad \text{(Eq. 2)}$$

Note in the equation there is multiply operation by 2, because the mean-square of the analysis window is 0.5, so we compensate it.

The temporal masking effect should be recognized as having a great impact on how humans perceive a sound. Temporal masking occurs when a sudden stimulus sound makes inaudible other sounds which are present immediately preceding (pre-masking) or following (post-masking) the stimulus. In general, if there is a temporal masking effect in the original audio signal, it is preferred to retain it in the processed signal so that human perception remains the same. In other words, the masking stimulus (i.e. the loud sound) is probably the most important sound element in that particular interval, and there is no compelling reason to alter the masked sound more than the stimulus itself. In theory, the post-masking in the time domain lasts only about 200 milliseconds; however, from a practical point of view, a much longer masking time may be implemented to get rid of unnecessary gain fluctuations, better preserving the waveform.

The peak loudness value, PeakdB, updated every frame, is used to simulate the temporal masking effect. The implementation process of PeakdB can be seen in the following pseudo code:

```
if( wb_RMSdB > prev_peakdB )
    peakdB = wb_RMSdB;
else
    peakdB = ( 1 - γ) * wb_RMSdB + γ * prev_peakdB;
end
``` where wb_RMSdB is calculated in Eq.1, prev_peakdB is peak loudness value of last frame, and γ is a smoothing factor in the range [0.5, 0.9]. We can see that precedence is clearly given to high power frame. And when a RESET signal is received from the silence detection module 313, peakdB will reset to a pre-defined value in the range [−50, −90]dBFS. The peak loudness value is used by AGC module 302 and MDRC module 304 to simulate temporal masking effect. Basically speaking, when a current frame wideband loudness is lower than the peak loudness, the gain will remain unchanged.

Silence detection according to embodiments of the present disclosure will now be described in more detail. When program/channel switches occur, usually there will be some time of silence or low level signal in between. This function tries detects program changes based on this low level signal. In an embodiment of the method, for each frame, it is classified to two states, RESET and NORMAL. When wideband loudness (calculated in Eq.1) for the frame is lower than the set threshold, we will assume it is a low level signal. Thus, in NORMAL state, if the duration of continuous low level signal exceeds certain threshold, we will switch to RESET state. On the other hand, in RESET state, if the duration of continuous higher level signal exceeds set threshold, we will switch to NORMAL state.

Figure 6:
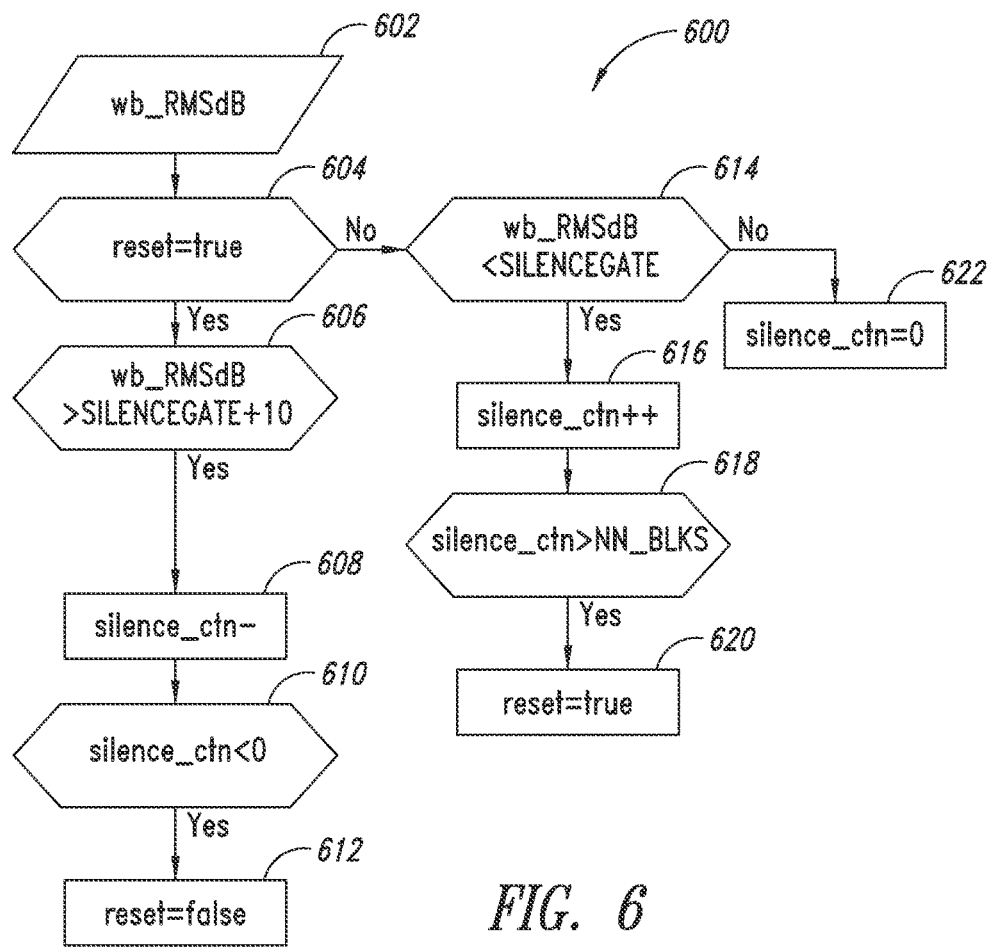
FIG. 6 is a flowchart illustrating a decision process for silence detection according to one embodiment of the present disclosure.

In an embodiment of the present disclosure, the decision process is depicted by the flowchart in FIG. 6. The meaning and typical values of the constants involved are explained below:
1) RESET state is identified when variable reset=TRUE, and otherwise NORMAL state;
2) SILENCE_GATE: the absolute threshold in the range [−50, −90]dBFS below which the signal is considered as low level signal;
3) NN_BLKS: the number of accumulated low level frames above which the signal is considered as being silent and hence triggers RESET state to be set, typically corresponding to a duration of 0.5 to 3 seconds.

The RESET state is used in peak loudness estimation, AGC module and MDRC module to reset some smoothed loudness quantity that can reduce convergence time in the initial time.

Noise detection according to embodiments of the present disclosure will now be described in more detail. Traditional automatic gain controls (AGCs) are simplistic and control the volume level by detecting the input signal level and then adjusting the entire signal. This typically generates undesirable artefacts, such as "breathing" where the noise floor rises and falls drastically along with the signal level and "pumping" where low levels signals are lost. To prevent this annoying "breathing" or "pumping" of background noise, a noise detection module is used to analyze the signal. General noise detection/suppression algorithm can be used to help decide the possibility whether the current frame is noise or not.

In one embodiment, the following noise detection method is utilized. First, the whole spectrum is separated into several sub-bands, and power for each sub-band is calculated. Second, based on the power of each band the noise spectrum are estimated; Third, based on current frame spectrum and the noise spectrum, activity score is calculated which will be used to decide whether the current frame is noise or not.

The calculation of sub-band power according to one embodiment will now be described in more detail. In one embodiment, the spectrum can be separated to 24 Bark Bands to do noise detection analysis. The definition of Bark bands are shown in Table 1 below. Please note that the spectrum can be separated to any sub-bands after careful tuning.

TABLE 1

| Number | Cut-off Frequency (Hz) | Bandwidth (Hz) |
|---|---|---|
| 1 | 100 | 100 |
| 2 | 200 | 100 |
| 3 | 300 | 100 |
| 4 | 400 | 100 |
| 5 | 510 | 110 |
| 6 | 630 | 120 |
| 7 | 770 | 140 |
| 8 | 920 | 150 |
| 9 | 1080 | 160 |
| 10 | 1270 | 190 |
| 11 | 1480 | 210 |
| 12 | 1720 | 240 |
| 13 | 2000 | 280 |
| 14 | 2320 | 320 |
| 15 | 2700 | 380 |
| 16 | 3150 | 450 |
| 17 | 3700 | 550 |
| 18 | 4400 | 700 |
| 19 | 5300 | 900 |
| 20 | 6400 | 1100 |
| 21 | 7700 | 1300 |
| 22 | 9500 | 1800 |
| 23 | 12000 | 2500 |
| 24 | 15500 | 3500 |

The power of each band is calculated by the following equation:

$$B(i, j) = 2 \times \sum_{k=start(j)}^{k=fin(j)} \left(\frac{|X(i, k)|}{N}\right)^2 \quad \text{(Eq. 3)}$$

where i is frame index, j is the band index and k is frequency bin index, start(j)/fin(j) is the index of the start and end for each bark band j, and X(i,k) is frequency domain signal of frame i. The multiply operation by 2 is to compensate the effect of analysis window, same with Eq.1.

The noise power estimation according to one embodiment will now be described in more detail. The signal sub-band power spectrum B(i,j) of each frame is stored in a circular array N(i,j), such that the latest entry will overwrite the oldest entry, this array is used for estimating the noise power spectrum, if the frame is deemed as containing non-noise content to a high likelihood, the previous noise power is substituted for the actual noisy signal power, scaled with a factor for correction. The actual implementation can be seen in the following pseudo code:

if (prev_Score_sm > NOISE_TH )
    The array NOISE_POW_CORRECTION_FACTOR · N(i−1, j) is copied to circular buffer
else
    The array B(i,j) is copied to the circular buffer where prev_Score_sm is the smoothed activity score of previous frame, and NOISE_TH is an absolute threshold in the range {0.5, 3}, N(i−1, j) denotes the noise power of the jth sub-band of the (i−1)th frame, B(i,j) denotes the power for the jth sub-band of the ith frame. The size of noise power circular array may correspond to a time interval of about 150 to 300 milliseconds.

The noise power spectrum in sub-bands is estimated every frame. There are two different scenarios in noise power estimation. First, if we know the current frame contains only noise to a high likelihood, we could immediately have an estimate of the noise power from the current frame. The more complicated scenario is that when the current frame contains non-noise, we will employ temporal tracking technique to estimate the noise power. In either case, it is necessary to smooth the estimated noise power with respect to the previous estimate, so that it does not change too abruptly.

Scenario 1: prev_Score_sm<=NOISE_TH: When last frame smoothed activity score is below threshold NOISE_TH, the current signal power will be used directly as noise power, and smoothed with the previously estimated noise power:

$$N(i,j) = \alpha \cdot N(i-1,j) + (1-\alpha) \cdot B(i,j), \quad \text{(Eq. 4)}$$

where N(i,j) denotes the noise power of the jth sub-band of the ith frame, B(i,j) denotes the power for the jth sub-band of the ith frame, and $\alpha$ is the smoothing factor in the range [0.65, 0.95].

Scenario 2: prev_Score_sm>NOISE_TH: When the current frame is a mixture of noise and non-noise, noise power in each sub-band is estimated based on the idea of temporal tracking. Given the assumption that noise is stable, it is reasonable to expect the noise to change much more slowly than non-noise. For a particular sub-band, if we rank the noise power of the past M frames, the few lowest frames will give a reasonable estimate because they are less likely to contain non-noise.

Let X'(l,j) denote the lth smallest power of the jth band of the recent M frames. Then the estimated noise power is computed as, $$N_{est}(i, j) = \frac{1}{m} \sum_{l=1}^{l=M} X'(l, j)$$

and then smoothed, $$N(i,j) = \alpha \cdot N(i-1,j) + (1-\alpha) \cdot N_{est}(i,j), \quad \text{(Eq. 5)}$$

where $\alpha$ is the smoothing factor in the range [0.65, 0.95].

Furthermore, the maximum growing rate of the estimate noise power should also be limited; otherwise the noise power would grow too fast when there is loud content continuously. This can be achieved by:

$$N(i,j) = \min(\text{NOISE\_GROW\_RATE\_MAX} \cdot N(i-1,j), N(i,j)).$$

where NOISE_GROW_RATE_MAX is a limit constant in the range [1.5, 5].

The activity score calculation according to one embodiment will now be described in more detail. A score is assigned to every frame to indicate the possibility of existence of non-noise signal. It is continuous and non-negative, with a larger value indicating higher possibility of containing non-noise content. The score is computed based on a combination of two metrics: score1 taking into account the shape of the signal's power spectrum, and score2 the total power.

Specifically, score1 is a function of the number of bands of the current frame having greater power than corresponding bands of the previously estimated noise scaled by a factor.

$$score1 = \sum_j I(B(i, j) > \text{NOISE}_{POW_{FACTOR}} \times N(i, j)) \quad \text{(Eq. 6)}$$

where function I(true)=1, I(false)=0.

Score2 is related to the ratio of total power of the current frame to that of the previous noise.

$$score2 = spow/npow \text{ where } spow = \sum_j B(i, j), \quad \text{(Eq. 7)}$$

$$npow = \sum_j N(i, j)$$

The final score is a weighted sum of these two scores as follows:

$$\text{FrameScore} = w1 * score1 + w2 * score2 \quad \text{(Eq. 8)}$$

where w1 and w2 are normalization factors in the range [0.1, 0.5].

The frame score is further smoothed to avoid abrupt change; the implementation process can be seen clearly in the following pseudo code:

```
if( FrameScore > prev Score_sm )
    Score_sm = FrameScore;
else
    Score_sm = ( 1 – γ ) * FrameScore + γ * prev_Score_sm;
End
``` where prev_Score_sm is the smoothed activity score of last frame, and γ is a smoothing factor in the range [0.65, 0.99]. Besides this, when reset signal is received from silence detection module, Score_sm will be set to FrameScore as initial value.

The automatic gain control and operation of the AGC module according to one embodiment will now be described in more detail. The purpose of AGC is to adjust the signal loudness level to target level by applying adaptive gain calculated based on current frame loudness of the signal. In an embodiment of the present disclosure, the AGC module is wideband; the reason why multiband AGC is not used, is that multiband AGC will change the spectral balance of audio signal very much, making the listening experience very different from the input.

The wideband AGC will try to level the signal to target loudness level with content analysis and proper gain smoothing. If input loudness level is below the target, then the AGC will raise its internal volume control to approach the target level. If the input audio level is above the target, then the AGC will lower the volume.

In one embodiment of the proposed method, the AGC will derive a target gain, denoted wideGainDB, to be multiplied with the input signal (after converting to the linear domain) to maintain a consistent average loudness. Normally we need to estimate a smoothed loudness as reference to derive the target gain. In the current disclosure, we find using peak loudness value (calculate in Eq.1) is a very good alternative. As mentioned above, temporal masking effect is quite important on how humans perceive a sound; using the peak loudness value as the reference; we can better preserve the temporal masking effect.

Figure 7:
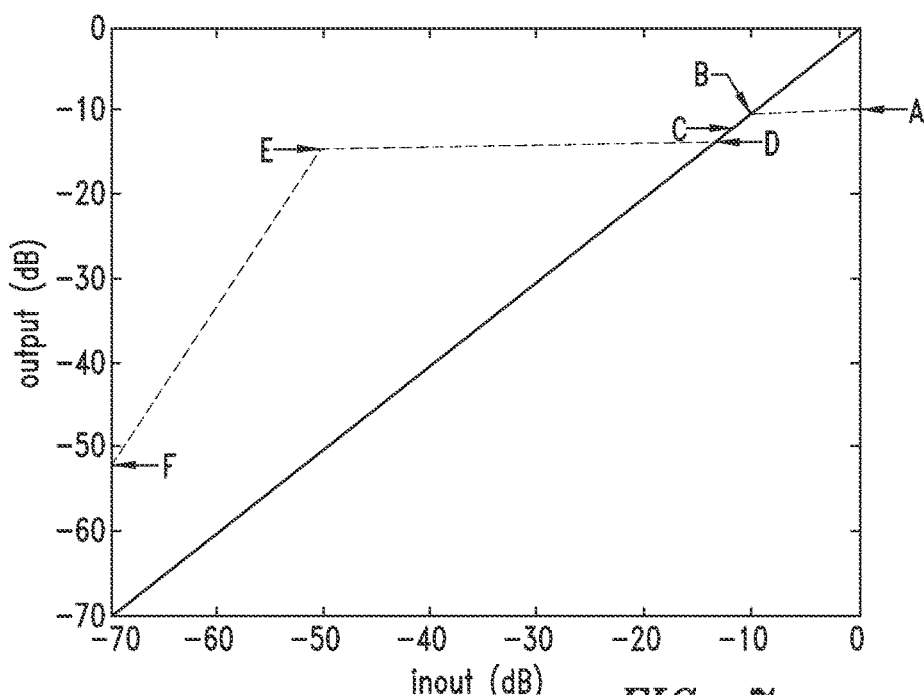
FIG. 7 is a graph illustrating an example relationship between a target gain and the loudness of the input audio signal.

In one embodiment, the relationship between the target gain wideGainDB and input peak loudness value peakdB may follow a curve similar to that shown in FIG. 7. In the figure, we can see there are 4 segments in the plot: 1) segment AB, when the input value is bigger than the compression threshold we will try to attenuate the input with a negative gain; 2) segment BD, a linear segment, usually has a small range, say 3 dB, just to allow small variations in the input signal to pass through without introducing unnecessary short-term waveform modulation; 3) segments DE and EF, boosting segments, if lower than the target level, we will try to boost the signal accordingly, the reason why in segment DE gain is increasing with the level is that we assume the higher level is more likely to be useful signal instead of noise/background signal, and the slope of segment DE is configurable to control the aggressiveness of the algorithm. It should be noted that the Target Level, which is the mid-point of the linear segment of the curve BD in FIG. 7, correspond to desired loudness level with headroom and proper calibration.

Figure 8:
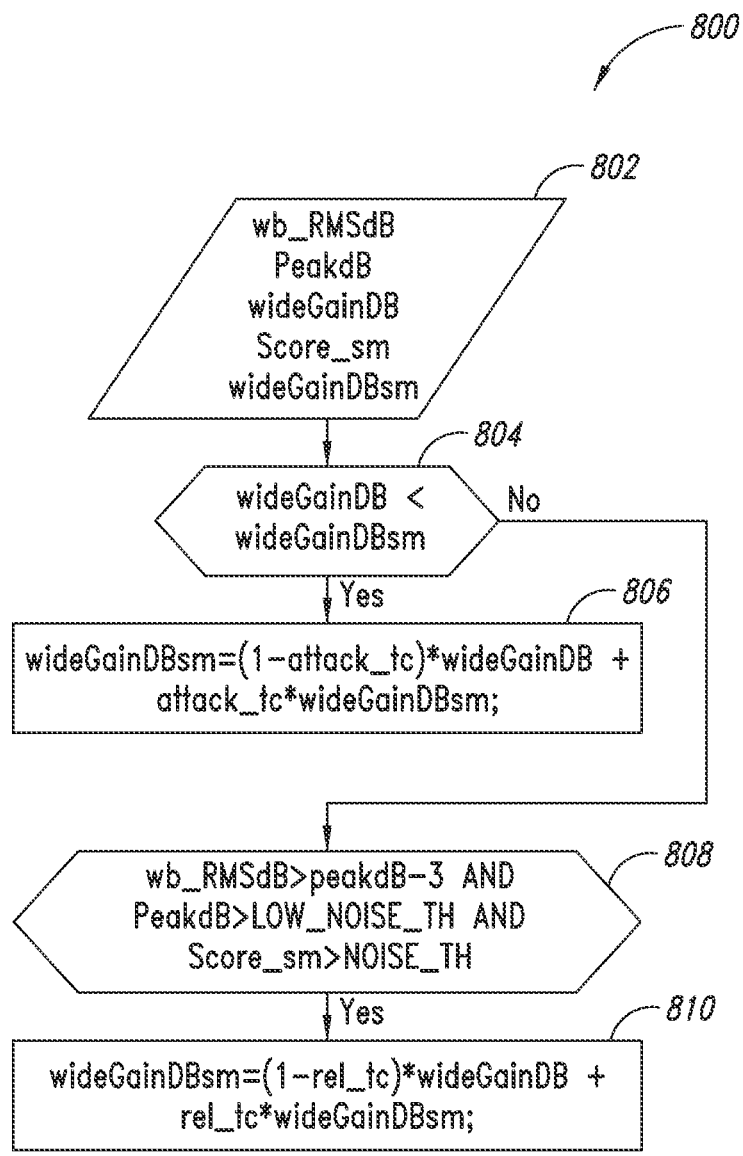
FIG. 8 is a flowchart of a process for smoothing the gain applied to the frame data in the frequency domain.

In one embodiment of the proposed method, the derived gain wideGainDB, is subject to further smoothing to ensure pleasant alteration to the audio signal. The flowchart in FIG. 8 depicts the process. If the wideGainDB is smaller compared with previous gain value wideGainDBsm, we will assume a loud content happened, and we need to change the gain faster using faster attack smoothing factor attack_tc. Otherwise, if wideGainDB is bigger than previous gain value wideGainDBsm, the gain is allowed to change only when all the following conditions are met: 1) wideband loudness of the current frame (wb_RMSdB) is bigger than the peak loudness value minus a certain value in the range [1, 6]dB, this is to simulate the temporal masking effect; 2) and the peak loudness level peakdB is bigger than a defined absolute level; 3) the activity score calculated in noise detection module must be higher than noise threshold in the range [−45, −70]dBFS. Conditions 2-3 is to ensure that low noise signal are not boosted too much and noise level does not fluctuate too much. And when the gain is allowed to change, we will use relative slower release smoothing factor rel_tc. Besides this, when reset signal is received from silence detection module, wideGainDBsm will be set to wideGainDB as initial value.

Furthermore, in an embodiment, the peak loudness (peakdB) change rate is calculated to speed up the gain change when the input loudness is increasing. The idea comes from a simple heuristics that when the input volume does not change (or the change is small), the leveller should not change the loudness a lot. In contrast, when the loudness changes fast, the loudness can change slightly faster without affecting the characteristics of the input too much. The process is illustrated in the following pseudo code:

```
    if ( prev_peakdB >= peakdB )
        dif = 0;
    else
        dif = ( peakdB - prev_peakdB) / NORM_ FACTOR;
    end
    dif = MIN( dif, DIFLIMIT );
    attack_tc = attack_tc - dif;
    rel_tc = rel_tc - dif;
```

In the code, peakdB is peak loudness value of the current frame, prev_peakdB is the value for previous frame, and NORM_FACTOR is a constant in the range [10, 50] that normalizes the peak loudness change rate to the range between 0 and 1, while DIFLIMIT is a parameter to ensure that the difference dif is not too big.

The multiband dynamic range compression and operation of the MDRC module 304 (FIG. 3) according to one embodiment will now be described in more detail. Besides the wideband gain control provided by the AGC module 302, the system and method 300 in one embodiment utilizes multiband dynamic range compression through the MDRC module 304 to further reduce the dynamic range of audio signal. Compared with the AGC module 302, the MDRC module 304 works at a faster time scale, which means the attack/release smoothing factor that controls gain smoothing speed is relatively faster. The MDRC module 304 separates the whole spectrum into several sub-bands and focuses on compressing the loud signals in each sub-band. By compressing individual frequency bands separately, multiband compression can minimize inter-band "pumping", whereby a loud signal at sub-band triggers compression at other sub-bands as well. In an embodiment of the present disclosure, the MDRC module 304 can be user configurable, e.g., sub-band boundary, compression curve, post-gain, and work independently after the AGC module 302.

For human auditory system, our ears are more sensitive to certain frequencies, such as in the 2-4 kHz range. Although not accurate, we will assume typical audio signals have a frequency distribution similar with pink noise. Pink noise has a 1/f frequency distribution, which means the power spectral density is inversely proportional to frequency; i.e., each octave band contains an equal amount of noise power. In an embodiment of the disclosure, for sampling rate 48 kHz, the whole spectrum are separated into 8 bands and the cut-off frequencies used is (unit in Hz) shown in the following table.

TABLE 2

| 187 | 375 | 750 | 1500 | 3000 | 6000 | 12000 | 24000 |
|---|---|---|---|---|---|---|---|

Thus for all sub-bands, we can use a universal threshold in the compression curve. The loudness of each sub-band is calculated using Eq. 3 with above cut-off frequencies. Please note that the spectrum can also be separated to other sub-bands setting after careful tuning of the compression threshold.

The loudness for each sub-band are further smoothed to avoid excessive fluctuations, the process is illustrated in the following pseudo code:

```
    for each band
        if RMSdB > RMSdBfast
            c = fastAttC;
        else
            c = fastRelC;
        end
        RMSdBfast= (1-c) * RMSdB+ c * RMSdBfast;
    end
``` where, RMSdB_fast is the smoothed loudness for the sub-band, fastAttC and fastRelC are the fast and slow smoothing factors, respectively. A typical value of fastAttC would correspond to an attack time in the range [2, 100] milliseconds and that of fastRelC to a release time in the range [200, 1000] milliseconds. Besides this, when reset signal is received from silence detection module, for each band, RMSdBfast will be set to RMSdB as initial value.

Figure 9:
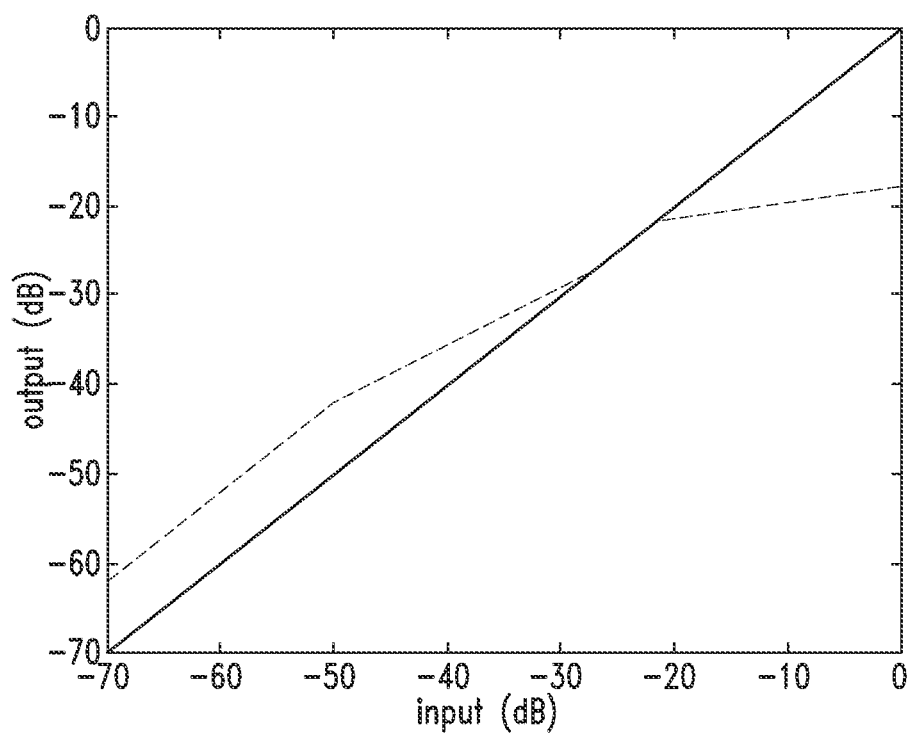
FIG. 9 shows an example relationship between a target gain and the input loudness in the multiband dynamic range compression of FIG. 3.

After we calculate the smoothed loudness (RMSdB_fast) for each sub-band, we will derive the gain following a compression curve shown in FIG. 9, the figure is similar to FIG. 7 used in AGC module 302 but more conservative on boosting the low level signal. Since we assume that the audio signal is pink noise like signal and we separate the spectrum into octave bands, the compression curve can be shared all over all the sub-bands. In the middle of the linear segment in the curve, the level is set according to the Target Level in AGC module 302 (point C in FIG. 7), minus a constant in the range [6, 30] dB.

Figure 10:
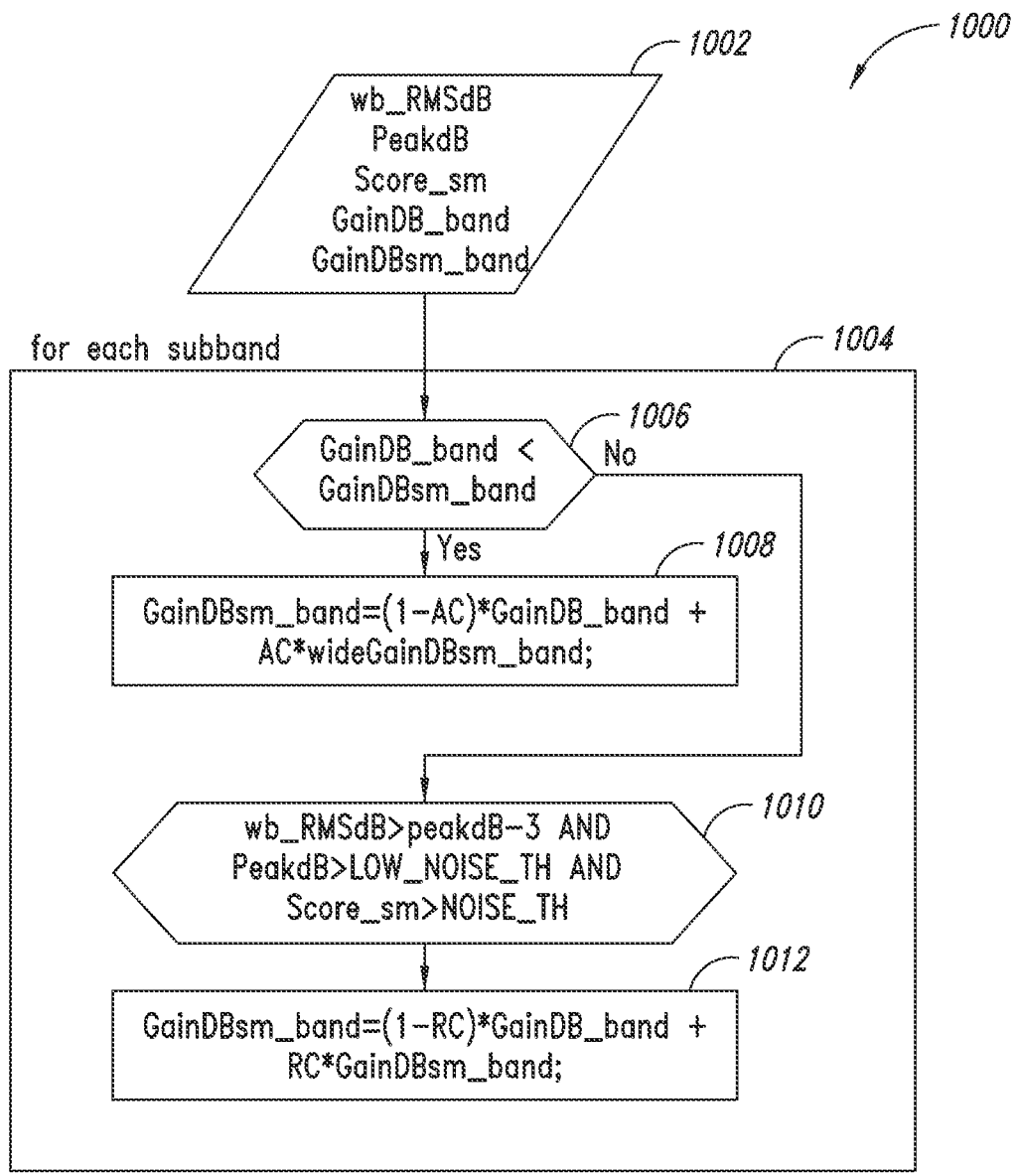
FIG. 10 is a flowchart showing the gain of the multiband dynamic range compression process is smoothed.

After we derive the gain for each sub-band, gain smoothing module 316 smooths the gain following the flowchart in FIG. 10 in one embodiment, which is quite similar to the gain smoothing measures in AGC module 302, but with different smoothing factors. A typical value of AC would correspond to an attack time of 40 milliseconds and that of RC to a release time of 1 second. Besides this, when reset signal is received from silence detection module, for each band, GaindBsm_band will be set to GaindB_band as initial value.

After we calculate the gain for each band, first we convert the gain of each band from log scale to linear scale, and compute gain for each bin using linear interpolation method followed by a linear phase low-pass FIR filter. The filter coefficients uses are {0.1, 0.2, 0.4, 0.2, 0.1}. The process is illustrated in the following pseudo code.

```
    for each band
        Gain(band) = 10^(GainDBsm(band)/20)
        for bin in each band
            Gh(bin) = Gain(band);
        end
    end
    Gh = FIR(Gh)
```

In the code, Gh is the gain for each frequency bin after FIR filter smoothing. The gain change over time for one example is illustrated in FIG. 11, and the input audio signal is the same as the input in FIG. 2. From top to bottom in FIG. 11, each subplot is related to band 1 to band 8, respectively. From the figures, we can see the gain differences for the different bands.

The application of the gain according to one embodiment will now be described in more detail. In an embodiment of the present disclosure, as shown in FIG. 2, there is look-ahead delay of 1 frame, if overlapping ratio is half, the actual delay for 1024 FFT size, 48 kHz sampling frequency is about 10.7 millisecond. The implementation of look-ahead mechanism in the present disclosure is by applying the gain derived from the current frame to frequency domain data of previous frame.

$$Y(i,k) = X_{prev}(i,k) \times Gh(k) \tag{Eq.9}$$

where $X_{prev}(i,k)$ is the frequency domain data for previous frame, and Gh is the smoothed i, gain of each frequency bin for current frame. If the latency caused by 1024 FFT size is too big, a smaller FFT size can be used, i.e. 512, or 256.

The frequency synthesis and overlap-and-add operations according to one embodiment of the system and method 300 will now be described in more detail. The processed signal spectrum is transformed back to the time domain by the inverse transformation method of frequency analysis being performed by the module 320. If FFT was used for frequency analysis as in the example embodiment of FIG. 3, then the module 320 applies the Inverse FFT (IFFT). After inverse FFT, the module 322 applies a synthesis window to suppress audible discontinuities. Then, the processed time domain signal of the current frame is aligned with the corresponding part of the previously processed frame and they are summed to produce the final output. The overlapping region of current frame with the next frame is saved for synthesis of next output frame. The synthesis window is the same with analysis window plotted in FIG. 4.

An embodiment that performs multi-channel processing will now be described in more detail. In this embodiment, a combined channel is obtained from all the available channels of the input (from stereo to 7.1). For every frequency bin, the respective bin in the combined channel will be the one with maximum value across all the channels. The procedure can be seen in the following formula.

$$X(i, k) = \max_c X_c(i, k) \qquad \text{(Eq. 10)}$$

where c is channel number from 1 to total number of channels. Then the gain is derived using the above techniques based on this combined channels, and applied to all channels.

One skilled in the art will understood that even though various embodiments and advantages of these embodiments of the present disclosure have been set forth in the foregoing description, the above disclosure is illustrative only, and changes may be made in detail and yet remain within the broad principles of the present disclosure. For example, the components described above may be implemented using either digital or analog circuitry, or a combination of both, and also, where appropriate, may be realized through software executing on suitable processing circuitry, as discussed with reference to FIG. 4. It should also be noted that the functions performed by the components 302-322 of FIG. 3 can be combined and performed by fewer components depending upon the nature of the electronic system 300 containing these components. Therefore, the present disclosure should be limited only by the appended claims.

The various embodiments described above can also be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. Pat. Nos. 8,437,480 and 8,275,611 and the non-patent publication ITU-R BS.1770-3 recommendation from the International Telecommunication Union, all of which are incorporated herein by reference, in their entirety. Aspects of the embodiments can be modified, if necessary to employ concepts of the various patents, applications and publications to provide still further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A frequency-domain system for modifying an amplitude of an input digital audio signal, comprising:
    a frequency analysis module configured to segment the input digital audio signal into overlapping frames and to apply an analysis window to each frame, and configured to then convert each frame to the frequency domain;
    a peak loudness value estimation module configured to estimate a peak loudness value used to derive an adaptive gain for each frame;
    an automatic gain control module configured to compute a wideband gain based on the peak loudness values to provide an adjusted digital audio signal in the frequency domain;
    a frequency synthesis module configured to convert the adjusted digital audio signal to the time domain;
    an overlap-and-add module configured to apply a synthesis window to the adjusted digital audio signal in the time domain to provide an output digital audio signal; and
    a multi-band dynamic compressor module configured to separate each frame into signals for sub-bands, each sub-band including at least one frequency bin and the multi-band dynamic compressor module further configured to compute a multi-band gain to compress the signal of each sub-band at a faster speed than the automatic gain control nodule computes the wideband gain, and wherein the multi-band dynamic compressor module is further configured to compute the gain of each bin based on linear interpolation and to then provide linear phase low-pass finite impulse response filtering to generate a gain for each frequency bin.

2. The frequency-domain system of claim 1 further comprising a noise detection module configured to detect background noise based on power information of each of the sub-bands.

3. The frequency-domain system of claim 2 further comprising a silence detection module to detect program switch.

4. The frequency-domain system of claim 1, wherein the multi-band dynamic compressor module is further configured to smooth the multi-band gain based on noise information and silence information.

5. The frequency-domain system of claim 4, wherein the multi-band dynamic compressor module includes user configurable parameters that define the operation of the multi-band dynamic compressor module.

6. The frequency-domain system of claim 4, wherein the multi-band dynamic compressor module is configured to change the gain for each sub-band at a first rate when the sub-band gain is decreasing and at a second rate that is less than the first rate when the sub-band gain is increasing.

7. The frequency-domain system of claim 2, wherein the noise detection module is further configured to determine whether a current frame is noise or not noise.

8. The frequency-domain system of claim 2, wherein the noise detection module is further configured to generate an activity score that is further smoothed to avoid excessive fluctuation.

9. The frequency-domain system of claim 8, wherein the automatic gain control module is further configured to reduce wideband gain fluctuation when the activity score calculated by the noise detection module is below a noise threshold.

10. The frequency-domain system of claim 8, wherein the multi-band dynamic compressor module is configured to reduce gain fluctuation when the activity score calculated in the noise detection module is below a noise threshold.

11. The frequency-domain system of claim 3 wherein the silence detection module is configured to detect program switch in the input digital audio signal based on an accumulated number of low level frames.

12. The frequency-domain system of claim 11, wherein the automatic gain control module is configured initialize the wideband gain based on a current gain of a frame when a reset signal is generated by silence detection module.

13. The frequency-domain system of claim 11, wherein the multi-band dynamic compressor module is configured to initialize the multi-band gain based on a current gain of the frame for each band when a reset signal is generated by the silence detection module.

14. A frequency-domain system for modifying an amplitude of an input digital audio signal, comprising
 a frequency analysis module configured to segment the input digital audio signal into overlapping frames and to apply an analysis window to each frame, and configured to then convert each frame to frequency domain;
 a peak loudness value estimation module configured to estimate a peak loudness value used to derive an adaptive gain for each frame;
 an automatic gain control module configured to compute a wideband gain based on the peak loudness values to provide an adjusted digital audio signal in the frequency domain;
 a frequency synthesis module configured to convert the adjusted digital audio signal to the time domain;
 an overlap-and-add module configured to apply a synthesis window to the adjusted digital audio signal in the time domain to provide an output digital audio signal; and
 a multi-band dynamic compressor module configured to separate each frame into signals for sub-bands, each sub-band including at least one frequency bin and the multi-band dynamic compressor module further configured to compute a multi-band gain to compress the signal of each sub-band at a faster speed than the automatic gain control module computes the wideband gain, and wherein the multi-band dynamic compressor is further configured to compute gains for each sub-band based on a compression curve and a single target level for several sub-bands and wherein the target level in the compression curve is calculated by subtracting a target level associated with the automatic gain control module by a constant.

15. The frequency-domain system of claim 14, wherein the automatic gain control module calculates the wideband gain based on a four-segment compression curve.

16. The frequency-domain system of claim 14, wherein the automatic gain control module is configured to change the wideband gain faster when the wideband gain is decreasing and to change the wideband gain slower when the wideband gain is increasing.

17. The frequency-domain system of claim 14, wherein the multi-band dynamic compressor module is further configured to compute a power for each of the sub-bands.

18. The frequency-domain system of claim 15, wherein the automatic gain control module is configured to scale the wideband gain based on a slope of the compression curve.

19. The frequency-domain system of claim 17, wherein the multi-band dynamic compressor module is configured to compute gains for each of the sub-bands based on a four-segments compression curve and a single target level for several sub-bands.

20. A frequency-domain system for modifying amplitudes of a plurality of input digital audio signals, comprising:
 a frequency analysis module configured to segment each input digital audio signal into overlapping frames and to apply an analysis window to each frame, and configured to then convert each frame to frequency domain;
 a peak loudness value estimation module configured to estimate a peak loudness value used to derive an adaptive gain for each frame;
 an automatic gain control module configured to compute a wideband gain based on the peak loudness values to provide for each input digital audio signal an adjusted digital audio signal in the frequency domain;
 a frequency synthesis module configured to convert each adjusted digital audio signal to the time domain;
 an overlap-and-add module configured to apply a synthesis window to each adjusted digital audio signal in the time domain to provide a corresponding output digital audio signal for each of the plurality of input digital audio signals;
 a multi-band dynamic compressor module configured to separate each frame into signals for sub-bands, each sub-band including at least one frequency bin and the multi-band dynamic compressor module further configured to compute a multi-band gain to compress the signal of each sub-band at a faster speed than the automatic gain control module computes the wideband gain; and
 a multi-processing channel module configured to generate a combined channel based on a plurality of input channels, each input channel being associated with a corresponding one of the plurality of input digital audio signals, and further configured to generate a gain based on all the plurality of input channels and applied to all the plurality of input channels.

21. The frequency-domain system of claim 20, wherein the frequency analysis module is further configured to apply to each frame converted to the frequency domain a frequency weighting curve based on ITU-R BS.1770 recommendation to generate frequency weighted data for each frame.

22. The frequency-domain system of claim 21, wherein the peak loudness value estimation module is further configured to smooth the estimated peak loudness value after the frequency analysis module applies the frequency weighting curve to thereby generate the peak loudness value.

23. The frequency-domain system of claim 22, wherein the automatic gain control module is configured to generate the wideband gain based on the peak loudness value.

24. The frequency-domain system of claim 22, wherein the automatic gain control module is further configured to simulates the temporal masking effect of human hearing based on the peak loudness value.

25. The frequency-domain system of claim 22, wherein the automatic gain control module is configured to reduce wideband gain fluctuation when peak loudness value is below a noise level threshold.

26. The frequency-domain system of claim 22, wherein the automatic gain control module is further configured to compute a rate of change of the peak loudness value and is configured to increase the change of the wideband gain based on the rate of change of the peak loudness value.

27. The frequency-domain system of claim 22, wherein the multi-band dynamic compressor module is configured to reduce multi-band gain fluctuation when the peak loudness value is below a noise level threshold.

28. The frequency-domain system of claim 22, wherein the multi-band dynamic compressor module is configured to simulate the temporal masking effect of human hearing to smooth the multi-band gains for the sub-bands based on the peak loudness of the signal.

* * * * *